(12) United States Patent
Wang

(10) Patent No.: US 8,405,989 B2
(45) Date of Patent: Mar. 26, 2013

(54) MOUNTING APPARATUS FOR FANS

(75) Inventor: Huan-Chin Wang, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 14 days.

(21) Appl. No.: 13/189,576

(22) Filed: Jul. 25, 2011

(65) Prior Publication Data

US 2012/0168602 A1 Jul. 5, 2012

(30) Foreign Application Priority Data

Dec. 31, 2010 (TW) .............................. 99147087 A

(51) Int. Cl.
*H05K 7/20* (2006.01)
(52) U.S. Cl. .......................... 361/695; 361/690; 361/688
(58) Field of Classification Search ............. 248/220.21, 248/220.22, 221.11, 222.11, 223.41, 560, 248/562, 565, 566, 590, 618; 416/246; 361/694, 361/695, 679.48–679.49, 679.46, 679.55, 361/689, 690, 717–722; 165/80.3; 257/721; 174/16.1; 312/223.2; 454/184; 415/119, 415/213.1

See application file for complete search history.

(56) References Cited

U.S. PATENT DOCUMENTS

| | | | | |
|---|---|---|---|---|
| 4,335,646 A * | 6/1982 | Jacquet et al. | ................. | 454/159 |
| 4,336,749 A * | 6/1982 | Barnhart et al. | .............. | 454/349 |
| 4,394,111 A * | 7/1983 | Wiese et al. | ................... | 417/360 |
| 4,590,335 A * | 5/1986 | De Luca et al. | ................. | 379/19 |
| 5,495,888 A * | 3/1996 | James | ........................... | 165/60 |
| 5,559,674 A * | 9/1996 | Katsui | ........................... | 361/697 |
| 5,579,827 A * | 12/1996 | Chung | ......................... | 165/80.3 |
| 5,620,169 A * | 4/1997 | Payne | ........................... | 267/160 |
| 6,183,200 B1 * | 2/2001 | Chang | ......................... | 416/146 R |
| 6,343,012 B1 * | 1/2002 | Rife | ................................ | 361/695 |
| 6,414,848 B1 * | 7/2002 | Chen | ............................. | 361/704 |
| 6,611,427 B1 * | 8/2003 | Liao | ................................ | 361/695 |
| 6,640,578 B2 * | 11/2003 | Wang et al. | ..................... | 62/428 |
| 7,038,342 B2 * | 5/2006 | Icarre et al. | ..................... | 310/91 |
| 7,104,753 B2 * | 9/2006 | Eubank et al. | ............. | 415/121.2 |
| 7,163,050 B2 * | 1/2007 | Wang et al. | ............. | 165/104.33 |
| 7,251,135 B2 * | 7/2007 | Crippen et al. | ............... | 361/695 |
| 7,286,350 B2 * | 10/2007 | Lee et al. | ...................... | 361/695 |
| 7,381,129 B2 * | 6/2008 | Avedon | ......................... | 454/230 |
| 7,532,471 B2 * | 5/2009 | Su | ................................... | 361/695 |
| 7,548,422 B2 * | 6/2009 | Hsieh | ............................ | 361/695 |
| 7,558,061 B2 * | 7/2009 | Franz et al. | .................... | 361/695 |
| 7,604,459 B2 * | 10/2009 | Horng et al. | ............... | 415/214.1 |
| 7,679,908 B2 * | 3/2010 | Yeh et al. | ...................... | 361/695 |
| 7,729,118 B2 * | 6/2010 | Lai et al. | ...................... | 361/699 |
| 7,796,386 B2 * | 9/2010 | Chou | ............................. | 361/695 |
| 7,824,155 B2 * | 11/2010 | Chen | ........................... | 415/213.1 |
| 7,861,708 B1 * | 1/2011 | Lyons | ........................ | 126/110 A |
| 7,903,412 B2 * | 3/2011 | Spivey | ......................... | 361/704 |
| 7,959,419 B2 * | 6/2011 | Borowski et al. | ......... | 417/423.15 |
| 2003/0079861 A1 * | 5/2003 | Lee | ............................... | 165/80.3 |
| 2004/0108104 A1 * | 6/2004 | Luo | ............................... | 165/181 |

(Continued)

*Primary Examiner* — Jonathan Liu
*Assistant Examiner* — Guang H Guan
(74) *Attorney, Agent, or Firm* — Altis Law Group, Inc.

(57) ABSTRACT

A mounting apparatus for a fan includes an accommodating member, a bracket rotatably received in the accommodating member, a latching tab contractively exposed through the bracket, and a torsion spring. The accommodating member defines a latching hole for the latching tab. The torsion spring is connected between the accommodating member and the bracket. The fan is mounted to and received in the bracket. When the bracket is rotated to a predetermined position in the accommodating member, the latching tab is latched in the latching hole, and the torsion spring is deformed, these two elements operate to absorb and nullify any vibration from the working fan.

13 Claims, 5 Drawing Sheets

U.S. PATENT DOCUMENTS

| | | | |
|---|---|---|---|
| 2006/0023419 A1* | 2/2006 | Kao et al. | 361/690 |
| 2006/0039110 A1* | 2/2006 | Foster et al. | 361/697 |
| 2006/0116065 A1* | 6/2006 | Ishii | 454/184 |
| 2007/0058343 A1* | 3/2007 | Deng et al. | 361/695 |
| 2008/0174967 A1* | 7/2008 | Chang et al. | 361/719 |
| 2010/0300648 A1* | 12/2010 | Grantham | 165/55 |
| 2011/0228477 A1* | 9/2011 | Hong | 361/695 |

* cited by examiner

MOUNTING APPARATUS FOR FANS

BACKGROUND

1. Technical Field

The present disclosure relates to an apparatus for mounting a fan.

2. Description of Related Art

Electronic devices, such as computers, generate a great deal of heat. The heat needs to be dissipated as quickly as possible. A common method for dissipating heat is to use fans to generate airflow to dissipate heat from a computer. Usually, the fans are fixed in a mounting device installed in the computer. However, the fans vibrate, generating noise as the fans operate, and excessive vibration may affect the operation of, or possibly damage, the components in the electronic devices.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
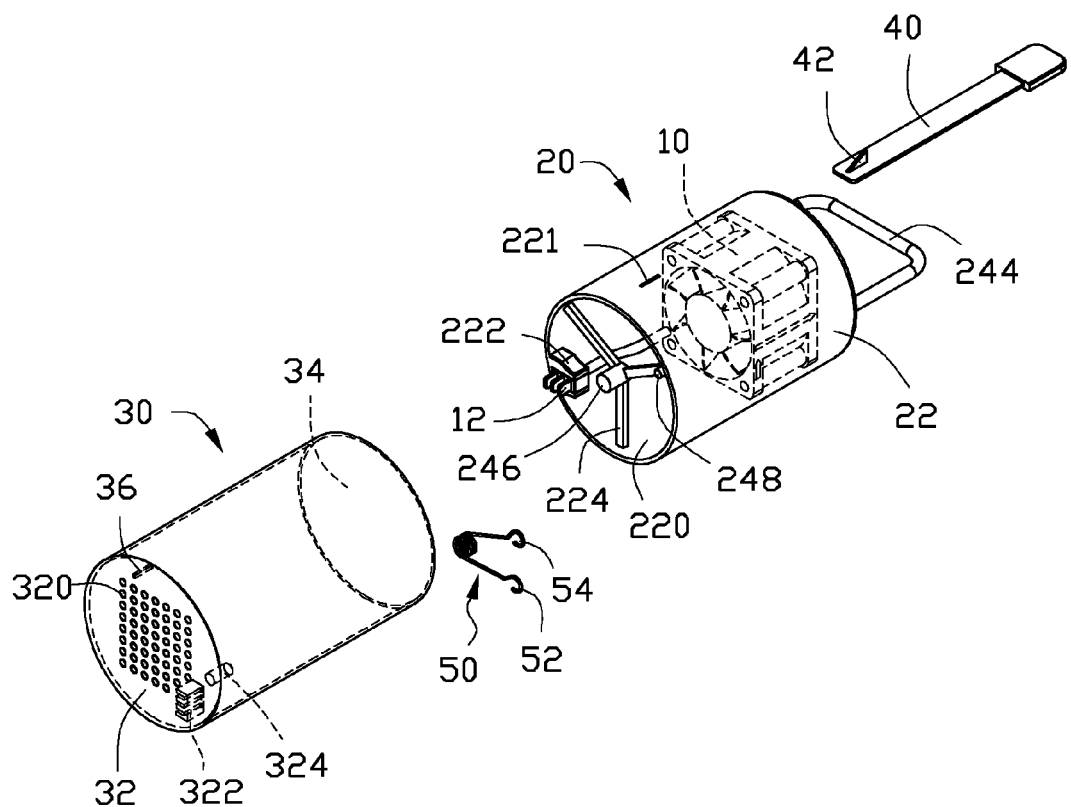
FIG. 1 is an exploded, isometric view of an exemplary embodiment of a mounting apparatus and a fan, the mounting apparatus includes a bracket.
Figure 2:
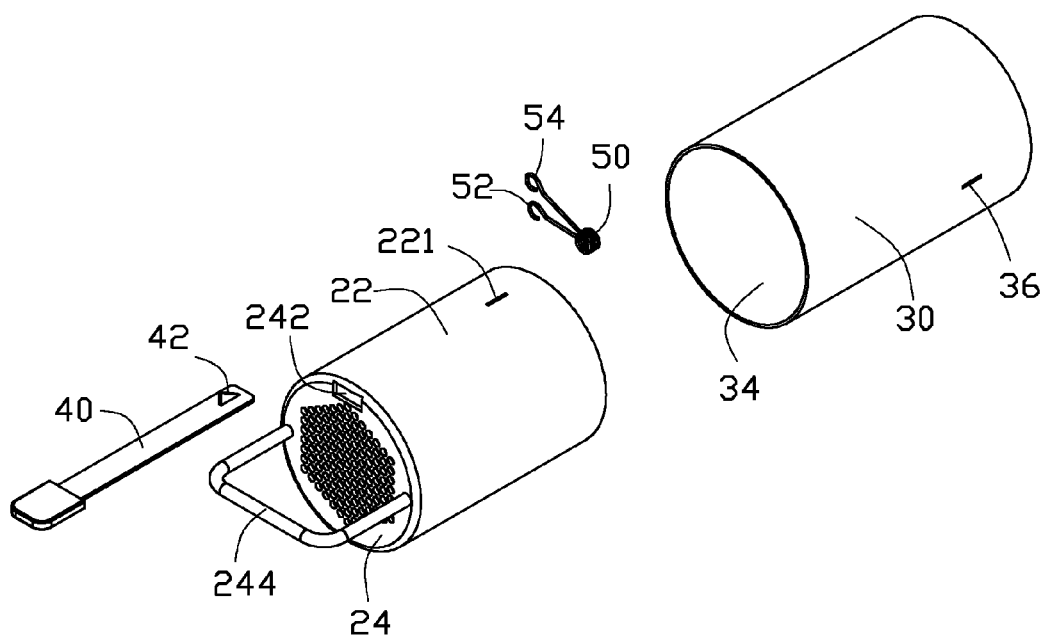
FIG. 2 is similar to FIG. 1, but viewed from a different perspective.

Referring to FIGS. 1 and 2, an exemplary embodiment of a mounting apparatus provides for the mounting of a fan 10 in or on an enclosure of an electronic device (not shown). The mounting apparatus includes a cylindrical enclosure (bracket 20) for mounting the fan 10, an accommodating member 30, a latching member 40, and a torsion spring of particular predetermined characteristics (torsion spring 50).

The fan 10 includes a connector 12.

The bracket 20 includes a hollow cylindrical main body 22. The main body 22 defines an opening 220 in a first end of the main body 22, and a baseboard 24 is detachably mounted to a second end of the main body 22 opposite to the first end. The baseboard 24 defines a through hole 242, abutting an edge of the baseboard 24, and includes a substantially U-shaped handle 244 extending out from the baseboard 24. The main body 22 defines a through hole 221. A straight line between the through holes 221 and 242 is parallel to an axis of the main body 22. The main body 22 further includes a latch 222 extending from an inner surface of the main body 22, adjacent to the first end of the main body 22, and three radial and uniformly-spaced bars 224 extending from the inner surface of the main body 22 adjacent to the latch 222. The first ends of the bars 224 are connected together to form a connection portion 245 (shown in FIG. 4). The connection portion 245 is concentric with the axis of the main body 22. The second ends of the bars 224 are connected to the inner surface of the main body 22. A first post 246 extends out from the connection portion 245. A second post 248 extends from one of the bars 224, adjacent the main body 22. In another embodiment, the bars 224, the first post 246, and the second post 248 are integral, and are detachably mounted to the first end of the main body 22.

The accommodating member 30 is hollow and cylindrical, and includes a bottom plate 32 connected to a first end of the accommodating member 30. A second end of the accommodating member 30 defines an opening 34. A connector 322 and a latching block 324 extend from an inner side of the bottom plate 32. The accommodating member defines a latching hole 36 therein, adjacent to the bottom plate 32. The bottom plate 32 further defines a plurality of centrally-grouped vents 320.

The latching member 40 is a resilient bar of predetermined characteristics and includes an integral latching tab 42 extending from one end of the latching member 40.

The torsion spring 50 includes a first latching end 52, and a second latching end 54.

Figure 3:
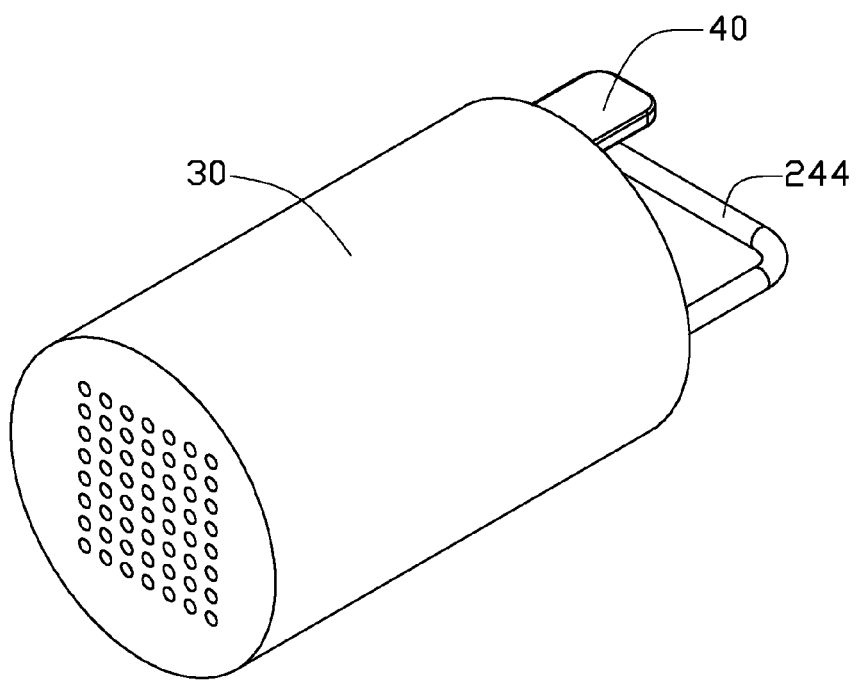
FIG. 3 is an assembled, isometric view of FIG. 1.
Figure 4:
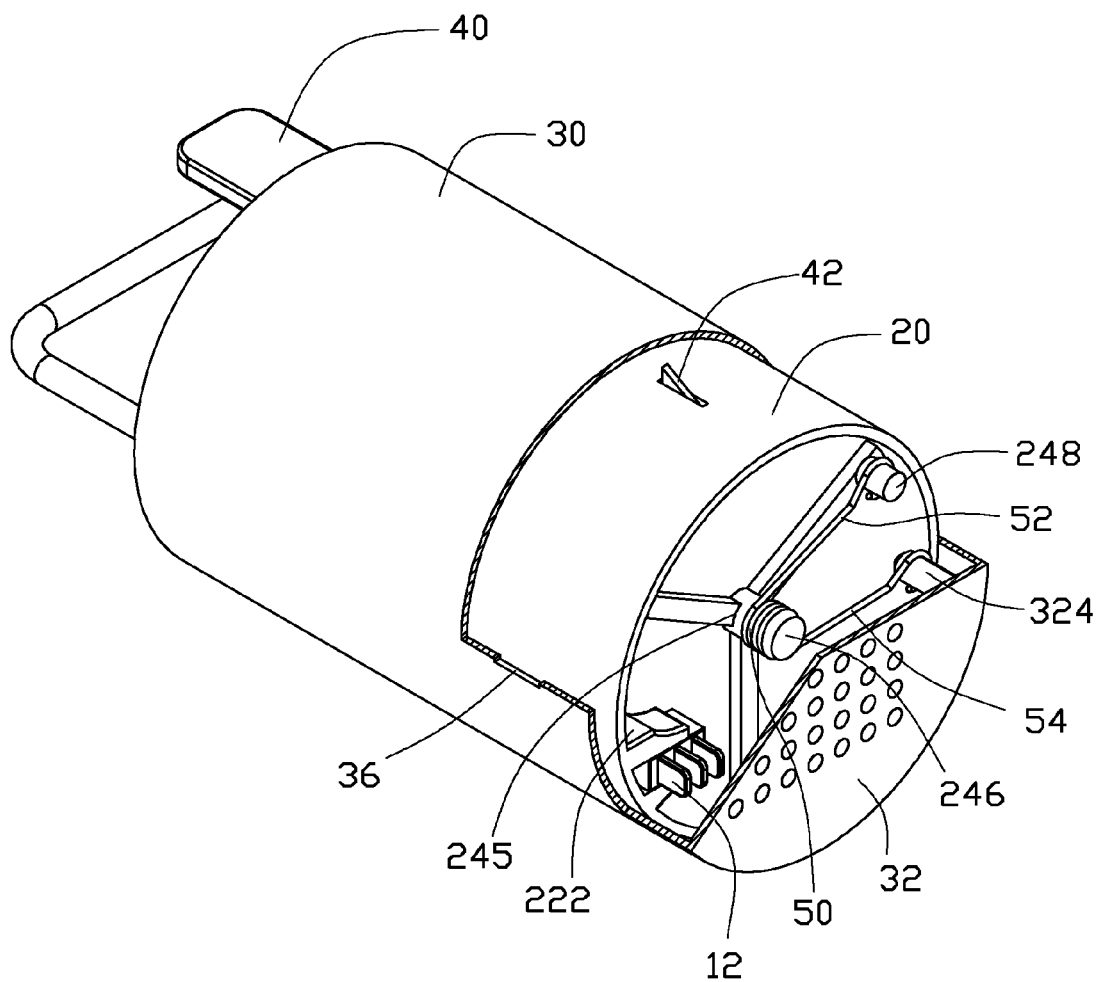
FIG. 4 and FIG. 5 are cutaway views of the mounting apparatus of FIG. 3.

Referring to FIGS. 3 and 4, in assembly, the fan 10 is mounted to the baseboard 24, opposite to the handle 244. The baseboard 24 is mounted to the second end of the main body 22 to locate the fan 10 in the main body 22. The connector 12 is affixed within or to the latch 222. The latching member 40 extends through the through hole 242 of the baseboard 24. The latching tab 42 extends through the through hole 221 of the main body 22 to be exposed out of the main body 22. The torsion spring 50 is fitted about the first post 246. The first latching end 52 is latched to the second post 248. The bracket 20 is inserted into the accommodating member 30 through the opening 34. The second latching end 54 of the torsion spring 50 is latched to the latching block 324. The latching tab 42 binds against an inner surface of the accommodating member 30.

Figure 5:
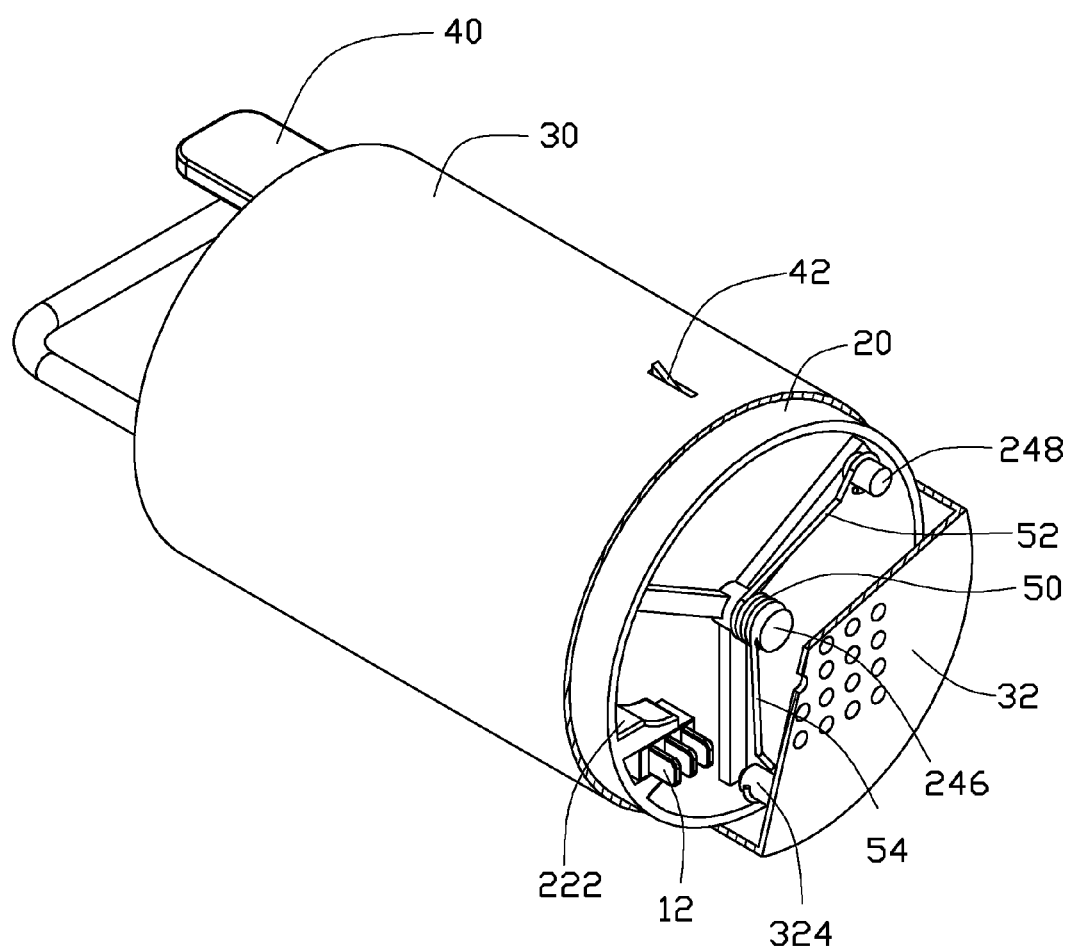

Referring to FIG. 5, the handle 244 is rotated relative to the accommodating member 30. When the latching tab 42 protrudes into and through the latching hole 36, the connector 12 will have been connected to the connector 322, and the torsion spring 50 deformed. Thus, the bracket 20 is held in place inside the accommodating member 30 by the torsion spring 50 and the latching member 40, which together can absorb vibrations when the fan 10 is working.

In other embodiments, the mounting apparatus does not include the latching member 40, the latching tab 42 (or a plurality of tabs) is formed on a surface of the main body 22.

The present embodiment and its advantages will be understood from the foregoing description, and it will be apparent that various changes may be made thereto without departing from the spirit and scope of the description, or sacrificing all of their material advantages, the examples hereinbefore described being merely exemplary embodiments.

What is claimed is:

1. A mounting apparatus for mounting a fan, comprising:
an accommodating member defining a latching hole;
a bracket to receive the fan therein, the bracket rotatably received in the accommodating member;
a latching member mounted to the bracket, with a latching tab contrastively exposed through the bracket; and
a torsion spring connected between the accommodating member and the bracket;
wherein when the bracket is rotated relative to the accommodating member to a predetermined position where the latching hole is aligned with the latching tab, the latching tab extends to be latched in the latching hole, and the torsion spring is deformed;

wherein the bracket comprises a cylinder-shaped main body to receive the fan, the main body defines a first through hole, the latching tab extends through the first through hole to be exposed out of the main body.

2. The mounting apparatus of claim 1, wherein the main body defines an opening in a first end of the main body, and a baseboard is detachably mounted to a second end of the main body opposite to the first end, the fan is mounted on an inner surface of the baseboard, the baseboard defines a second through hole for the latching member to extend through.

3. The mounting apparatus of claim 2, wherein the main body further comprises two bars extending from an inner surface of the main body adjacent to the opening to be connected together at an axis of the main body, first ends of the bars are connected together to form a connection portion, a first post extends out from the connection portion of the bars to fit about the torsion spring.

4. The mounting apparatus of claim 3, wherein a second post extends from one of the bars, the accommodating member comprises a bottom plate covering the opening of the main body of the bracket, a latching block extends from the bottom plate, a first end of the torsion spring is latched to the second post, a second end of the torsion spring is latched to the latching block.

5. The mounting apparatus of claim 4, wherein the bottom plate defines a plurality of vents.

6. The mounting apparatus of claim 1, wherein the bracket comprises a baseboard detachably mounted to a first end of the main body to fix the fan, the baseboard comprises a handle opposite to the fan.

7. The mounting apparatus of claim 6, wherein the main body defines an opening in a second end of the main body opposite to the baseboard, a latch extends from an inner surface of the main body, to latch a first connector of the fan, the accommodating member comprises a second connector of the fan to be connected to the first connector.

8. The mounting apparatus of claim 7, wherein the main body further comprises two bars extending from the inner surface of the main body adjacent to the opening to be connected together at an axis of the main body, a first post extends outward from a connection portion of the bars to fit about the torsion spring.

9. The mounting apparatus of claim 8, wherein a second post extends from one of the bars, the accommodating member comprises a bottom plate covering the opening of the main body, a latching block extends from the bottom plate, a first end of the torsion spring is latched to the second post, a second end of the torsion spring is latched to the latching block.

10. A mounting apparatus for mounting a fan, comprising:
an accommodating member defining a latching hole;
a bracket to receive the fan therein, the bracket rotatably received in the accommodating member;
a latching member mounted to the bracket, with a latching tab contrastively exposed through the bracket; and
a torsion spring connected between the accommodating member and the bracket;
wherein when the bracket is rotated relative to the accommodating member to a predetermined position where the latching hole is aligned with the latching tab, the latching tab extends to be latched in the latching hole, and the torsion spring is deformed; and
wherein the bracket comprises a main body to receive the fan and a baseboard detachably mounted to a first end of the main body to fix the fan, the baseboard comprises a handle opposite to the fan.

11. The mounting apparatus of claim 10, wherein the main body defines an opening in a second end of the main body opposite to the baseboard, a latch extends from an inner surface of the main body, to latch a first connector of the fan, the accommodating member comprises a second connector of the fan to be connected to the first connector.

12. The mounting apparatus of claim 11, wherein the main body further comprises two bars extending from the inner surface of the main body adjacent to the opening to be connected together at an axis of the main body, a first post extends outward from a connection portion of the bars to fit about the torsion spring.

13. The mounting apparatus of claim 12, wherein a second post extends from one of the bars, the accommodating member comprises a bottom plate covering the opening of the main body, a latching block extends from the bottom plate, a first end of the torsion spring is latched to the second post, a second end of the torsion spring is latched to the latching block.

* * * * *